(12) United States Patent
Schrems

(10) Patent No.: US 6,608,341 B2
(45) Date of Patent: Aug. 19, 2003

(54) TRENCH CAPACITOR WITH CAPACITOR ELECTRODES

(75) Inventor: Martin Schrems, Eggersdorf (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/097,490

(22) Filed: Mar. 14, 2002

(65) Prior Publication Data

US 2002/0125521 A1 Sep. 12, 2002

Related U.S. Application Data

(63) Continuation of application No. PCT/DE00/03063, filed on Sep. 5, 2000.

(30) Foreign Application Priority Data

Sep. 14, 1999 (DE) .......................................... 199 44 012

(51) Int. Cl.[7] .............................................. H01L 27/108
(52) U.S. Cl. ...................... 257/301; 438/243; 438/246; 438/386; 438/389; 438/592; 438/655; 257/68; 257/71; 257/301; 257/304; 257/305
(58) Field of Search ................................ 438/243, 246, 438/386, 389, 592, 655; 257/68, 71, 301, 304, 305

(56) References Cited

U.S. PATENT DOCUMENTS

| 4,918,502 A | 4/1990 | Kaga et al. |
| 4,937,205 A | 6/1990 | Nakayama et al. |
| 5,223,447 A | 6/1993 | Lee et al. |
| 5,250,829 A | 10/1993 | Bronner et al. |
| 5,262,002 A | 11/1993 | Grewal et al. |

(List continued on next page.)

FOREIGN PATENT DOCUMENTS

| EP | 0 831 532 A2 | 3/1998 |
| EP | 0 928 018 A2 | 7/1999 |
| EP | 0 949 680 A2 | 10/1999 |
| EP | 0 966 043 A1 | 12/1999 |
| EP | 0 986 289 A2 | 3/2000 |
| WO | WO 00/41459 | 7/2000 |

OTHER PUBLICATIONS

Frank S. Becker et al.: "Low Pressure Deposition of Doped $SiO_2$ by Pyrolysis of Tetraethylorthosilicate (TEOS)—II. Arsenic Doped Films", J. Electrochem. Soc., vol. 136, No. 10, Oct. 1989, pp. 3033–3043.

(List continued on next page.)

Primary Examiner—Hoai Ho
Assistant Examiner—Mai-Huong Tran
(74) Attorney, Agent, or Firm—Laurence A. Greenberg; Werner H. Stemer; Gregory L. Mayback

(57) ABSTRACT

A trench capacitor for use in a semiconductor memory cell is formed in a substrate. The trench capacitor includes a trench having an upper region and a lower region, an insulation collar formed in the upper region on a trench wall of the trench, and a buried well, through which the lower region of the trench at least partly extends. The trench capacitor further includes, as an outer capacitor electrode, a conductive layer lining the lower region of the trench and the insulation collar, a dielectric layer lining the conductive layer, and a conductive trench filling which is filled into the trench as an inner capacitor electrode. A method of fabricating a trench capacitor is also provided.

9 Claims, 9 Drawing Sheets

U.S. PATENT DOCUMENTS

| | | | |
|---|---|---|---|
| 5,336,912 A | | 8/1994 | Ohtsuki |
| 5,344,381 A | | 9/1994 | Cabrera y Lopez Caram |
| 5,512,767 A | | 4/1996 | Noble, Jr. |
| 5,571,743 A | | 11/1996 | Henkels et al. |
| 5,867,420 A | | 2/1999 | Alsmeier |
| 5,905,279 A | | 5/1999 | Nitayama et al. |
| 6,025,224 A | * | 2/2000 | Gall et al. .................. 438/243 |
| 6,150,210 A | * | 11/2000 | Arnold ....................... 438/243 |
| 6,163,045 A | * | 12/2000 | Mandelman et al. ....... 257/301 |
| 6,297,088 B1 | * | 10/2001 | King .......................... 438/243 |

OTHER PUBLICATIONS

C.M. Ransom et al.: "Shallow $n^+$ Junctions in Silicon by Arsenic Gas–Phase Doping", J. Electrochem. Soc., vol. 141, No. 5, May 1994, pp. 1378–1381.

D. Widmann et al.: "Technologie hochintegrierter Schaltun-Gen" [technology of highly integrated circuits], Springe Verlag, Berlin, 2nd ed., 1996, pp. 13–40.

* cited by examiner

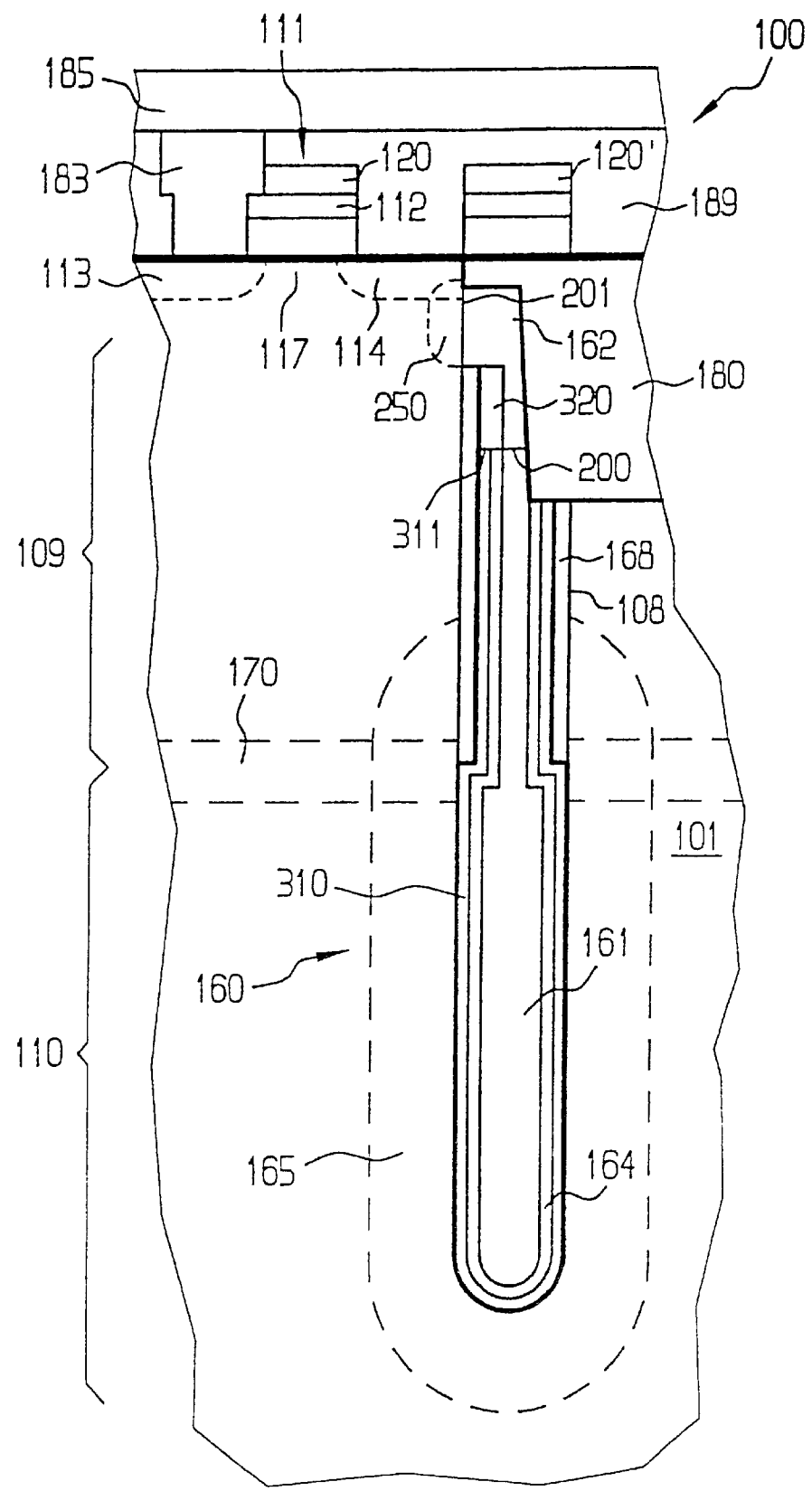

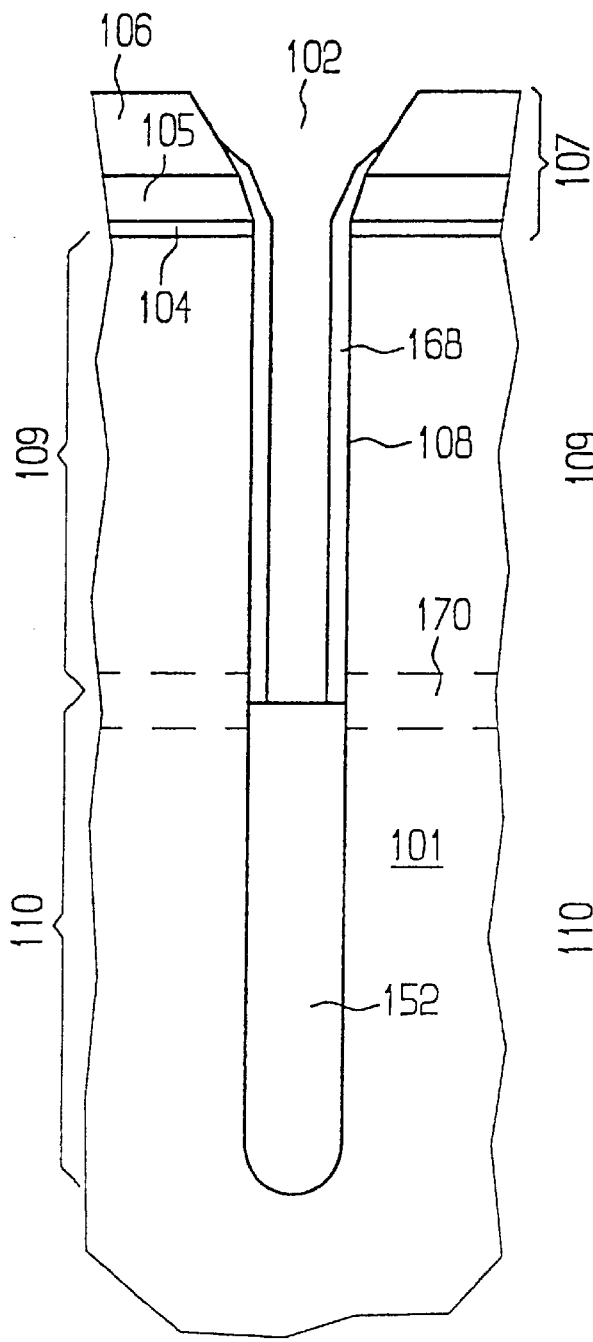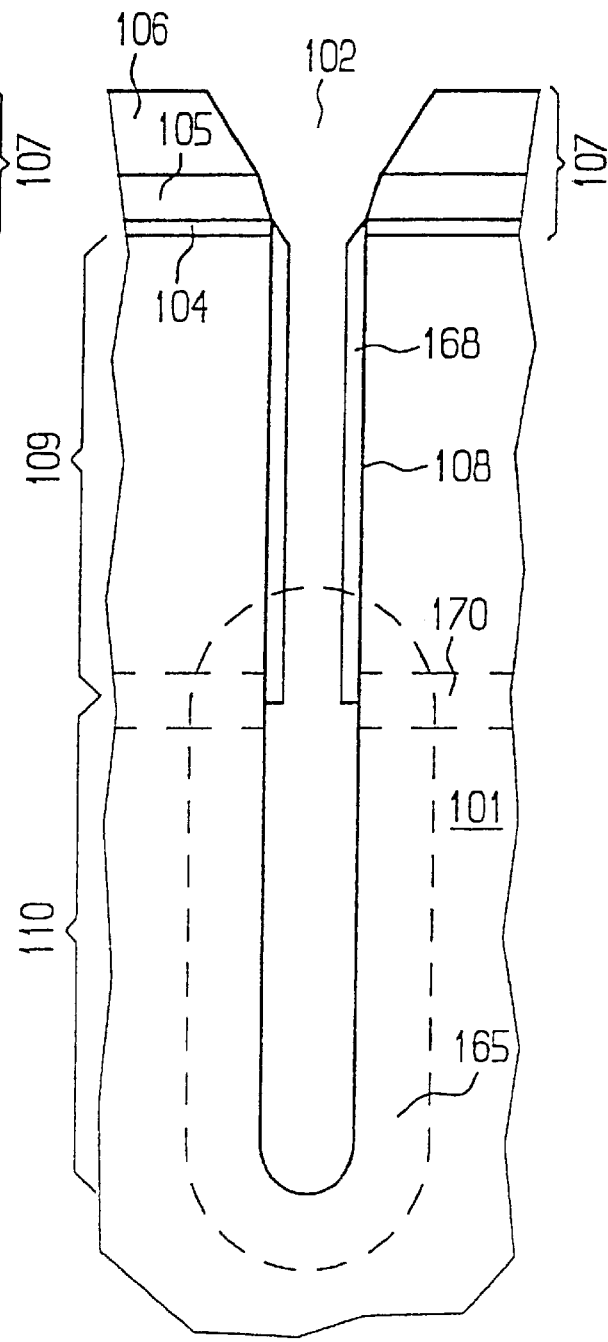

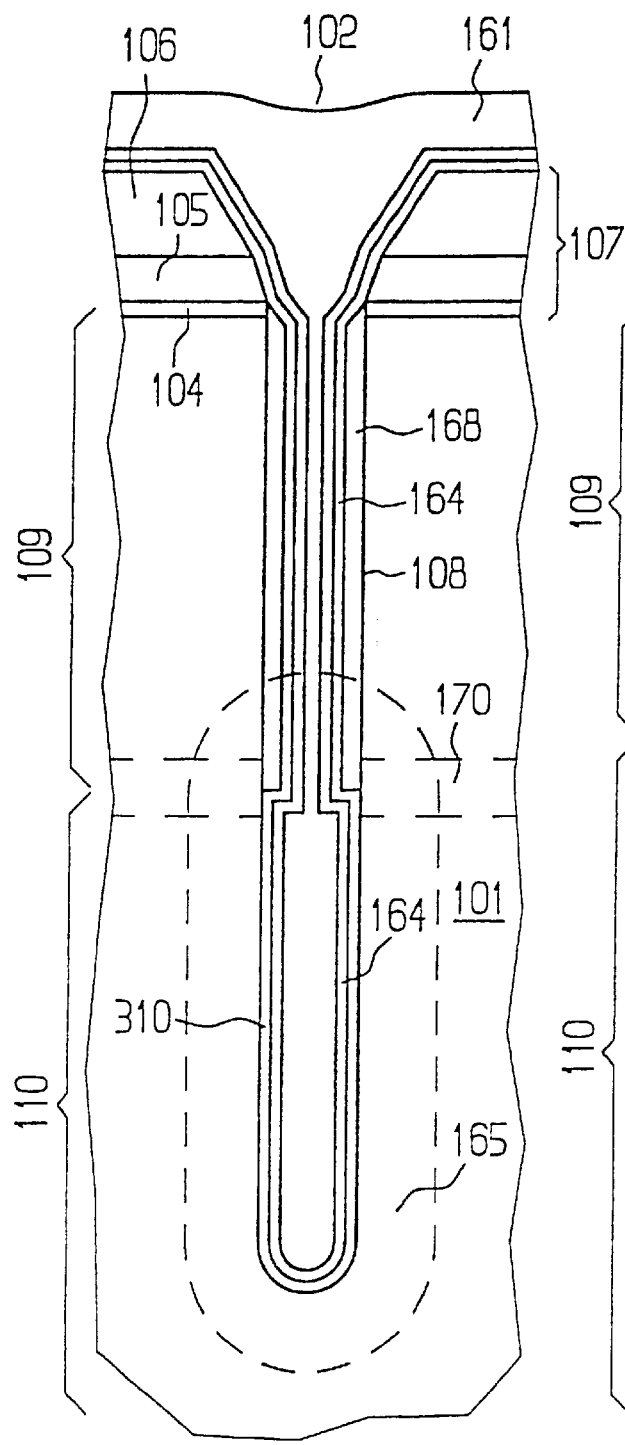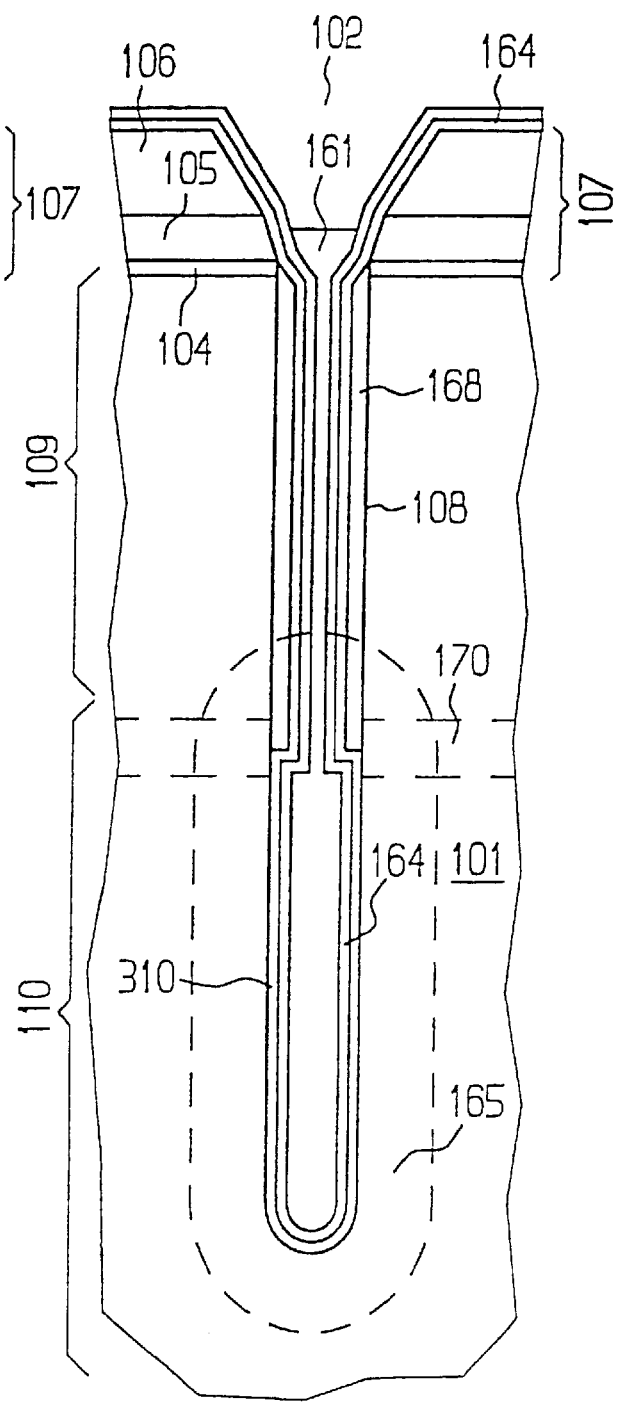

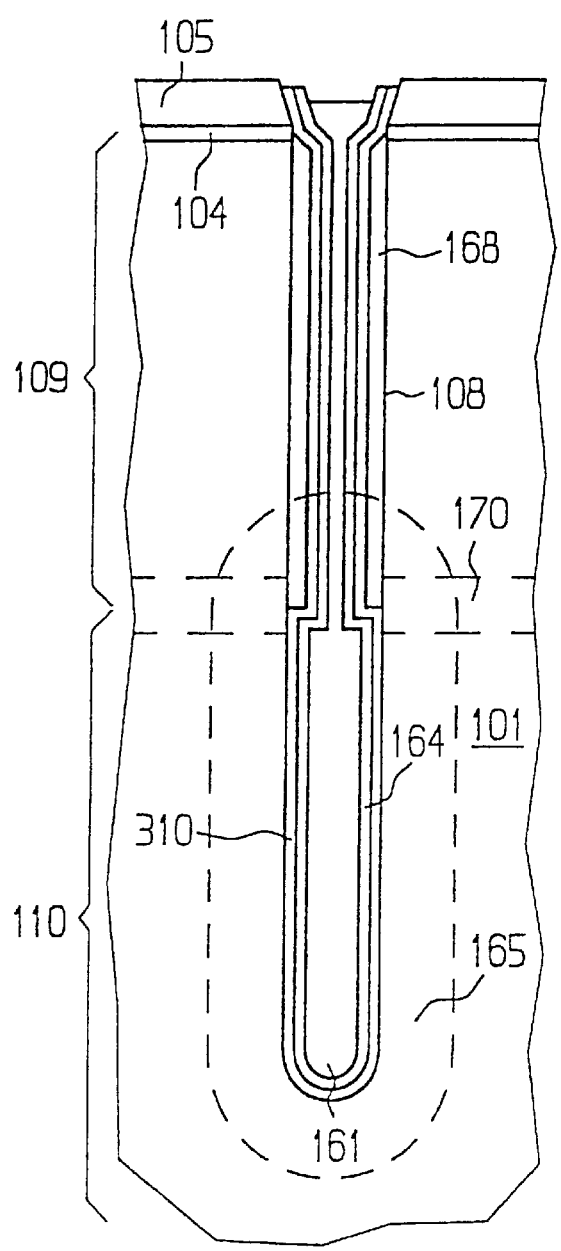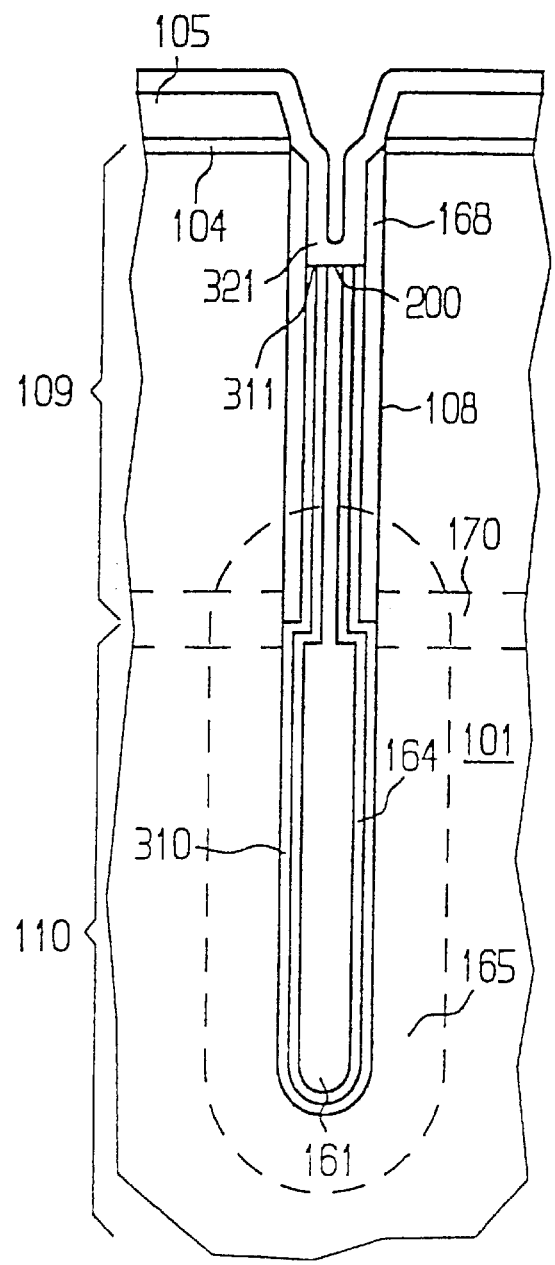

TRENCH CAPACITOR WITH CAPACITOR ELECTRODES

CROSS-REFERENCE TO RELATED APPLICATION

This application is a continuation of copending International Application No. PCT/DE00/03063, filed Sep. 5, 2000, which designated the United States.

BACKGROUND OF THE INVENTION

FIELD OF THE INVENTION

The invention relates to a trench capacitor and a corresponding fabrication method.

Integrated circuits (ICs) or chips, such as dynamic random access memory chips (DRAM), contain capacitors for storing a charge. In this case, the charge state in the capacitor represents a data bit.

A DRAM chip contains a matrix of memory cells which are provided in the form of rows and columns and are addressed by word lines and bit lines. The reading of data from the memory cells or the writing of data to the memory cells is performed by activating suitable word lines and bit lines.

A DRAM memory cell usually contains a transistor connected to a capacitor. The transistor contains two diffusion regions isolated by a channel which is controlled by a gate. Depending on the direction of current flow, one diffusion region is referred to as the drain region and the other as the source region. One of the diffusion regions is connected to a bit line, the other diffusion region is connected to the capacitor and the gate is connected to a word line. By the application of suitable voltages to the gate, the transistor is controlled in such a way that a current flow between the diffusion regions through the channel is switched on and off.

The charge stored in the capacitor decreases over time on account of leakage currents. Before the charge has decreased to an indeterminable level below a threshold value, the storage capacitor must be refreshed. For this reason, these memory cells are referred to as dynamic RAM (DRAM).

U.S. Pat. No. 5,867,420 discloses trench capacitor formed in a substrate. The central problem in known types of DRAM is the production of a sufficiently large capacitance for the trench capacitor. This problem will be aggravated in the future by the advancing miniaturization of semiconductor components. The continuous increase in the integration density means that the area available per memory cell and thus the capacitance of the trench capacitor decrease ever further. An excessively low capacitance of the trench capacitor can adversely influence the functionality and usability of the memory device, since an excessively small quantity of charge is stored on it.

By way of example, sense amplifiers require a sufficient signal level for reliably reading out the information situated in the memory cells. The ratio of the storage capacitance to the bit line capacitance is crucial in determining the signal level. If the storage capacitance is too low, the ratio may be too small for generating an adequate signal.

A lower storage capacitance likewise requires a higher refresh frequency, because the quantity of charge stored in the trench capacitor is limited by its capacitance and additionally decreases due to leakage currents. If the quantity of charge falls below a minimum quantity of charge in the storage capacitor, then it is no longer possible for the information stored therein to be read out by the connected sense amplifiers, the information is lost and read errors arise.

One way of avoiding read errors is to reduce the leakage currents. Firstly, the leakage current can be reduced by a transistor; secondly, the leakage current can be reduced by a capacitor dielectric; and, finally, the leakage current can be reduced by a buried strap or a buried contact to a buried plate. An undesirably reduced retention time can be lengthened by these measures.

A trench capacitor is usually used in DRAMs. A trench capacitor has a three-dimensional structure which is formed in a silicon substrate. An increase in the volume and thus in the capacitance of the trench capacitor can be achieved by etching more deeply into the substrate. In this case, the increase in the capacitance of the trench capacitor does not cause the surface occupied by the memory cell to be enlarged. However, this method is also limited, since the attainable etching depth of the trench capacitor depends on the trench diameter, so that it is only possible to attain specific, finite aspect ratios.

As the increase in the integration density advances, the substrate surface available per memory cell decreases ever further. The associated reduction in the trench diameter inevitably leads to a reduction in the capacitance of the trench capacitor. If the capacitance of the trench capacitor is dimensioned from the outset to be so low that the charge which can be stored is insufficient for entirely satisfactory readout by the sense amplifiers connected downstream, then this results in read errors.

SUMMARY OF THE INVENTION

It is accordingly an object of the invention to provide a trench capacitor which overcomes the above-mentioned disadvantages of the heretofore-known trench capacitors of this general type and which has an increased capacitance for the same trench diameter and the same trench depth. A further object of the invention is to provide a method of fabricating such a trench capacitor.

With the foregoing and other objects in view there is provided, in accordance with the invention, a trench capacitor, including:
- a substrate formed with a trench having a trench wall, the trench having an upper region and a lower region;
- an insulation collar formed in the upper region of the trench wall;
- a buried layer, the lower region of the trench at least partially extending through the buried layer;
- a dielectric layer disposed at the trench wall in the lower region of the trench and at the insulation collar;
- a conductive trench filling provided in the trench and serving as an inner capacitor electrode;
- a conductive layer serving as an outer capacitor electrode, the conductive layer being disposed such that, in the lower region of the trench, the conductive layer is disposed between the substrate and the dielectric layer and, at the insulation collar, the conductive layer is disposed between the insulation collar and the dielectric layer; and
- the conductive layer including a metal, a metal silicide or a metal nitride.

The idea underlying the present invention is using a conductive layer as an outer capacitor electrode. In conventional trench capacitors, the capacitor area is restricted to a lower region of a trench which lies below an insulation collar. By using the conductive layer in the lower region of the trench and on the insulation collar, the available area and thus the available capacitance is increased.

In one advantageous embodiment of the invention, a buried plate is formed in the substrate around the lower region of the trench, thereby improving the electrical contact between a buried well and the conductive layer.

In a further advantageous embodiment of the invention, the trench capacitor is doped below the surface of the substrate in the region of a buried strap, so that a buried contact is produced and advantageously electrically connects the buried strap or a trench filling to a source region of a transistor. The doping in the region of the buried contact may be introduced for example by implantation, plasma doping and/or gas phase doping or another suitable method.

In a further advantageous embodiment of the invention, the conductive buried strap is formed on the conductive trench filling, which forms the inner capacitor electrode. The advantage of this procedure resides in the greater flexibility in the production of the buried contact.

A further advantageous embodiment of the trench capacitor according to the invention provides the formation of an insulation web for insulating an upper region of the conductive layer. The insulation web has the task of preventing a charge transport from the conductive layer to the electrically interconnected conductive trench filling, the conductive buried strap and the buried contact. As a result, the retention time of the memory cell is advantageously lengthened and undesirable bit errors on account of leakage currents are prevented. In a specific embodiment, the insulation web is composed of an oxide, nitride or oxynitride.

A further advantageous embodiment of the invention provides for the conductive layer to be composed of silicon (doped or undoped), polycrystalline or amorphous), of a metal, of a silicide or a nitride. In this case, the metal used may be titanium, tungsten, molybdenum or cobalt. The silicide used may be titanium silicide, tungsten silicide, molybdenum silicide or cobalt silicide and the nitride used may be titanium nitride or tungsten nitride.

According to another feature of the invention, a conductive buried strap is disposed on the conductive trench filling.

According to another feature of the invention, the insulation web is configured to prevent a charge transport from the conductive layer to the conductive trench filling.

According to yet another feature of the invention, a conductive buried strap is disposed on the conductive trench filling; and an insulation web lines the conductive layer at least in an upper region thereof, the insulation web is configured to prevent a charge transport from the conductive layer to the conductive buried strap.

According to a further feature of the invention, an insulation web lines the conductive layer at least in an upper region thereof. The insulation web prevents a charge transport from the conductive layer to a buried contact.

With the objects of the invention in view there is also provided, a method for fabricating a trench capacitor, the method includes the steps of:

introducing a buried layer into a substrate;

forming a trench with an upper region and a lower region in the substrate;

forming an insulation collar in the upper region on a trench wall of the trench;

forming an outer capacitor electrode by lining the lower region of the trench and the insulation collar with a conductive layer;

forming a dielectric layer on the conductive layer at the lower region of the trench and at the insulation collar;

filling the trench with a conductive trench filling serving as an inner capacitor electrode; removing the conductive trench filling, the conductive layer and the dielectric layer as far as a level at which the insulation collar is disposed;

conformally depositing an insulation layer;

removing the insulation layer above the conductive trench filling; and removing the insulation layer such that the substrate is uncovered in the upper region of the trench.

According to another mode of the invention, a buried plate is formed in the substrate adjacent to the lower region of the trench prior to forming the conductive layer such that the buried plate makes contact with the buried layer which forms a buried well.

According to yet another mode of the invention, a conductive buried strap is formed on the conductive trench filling such that the conductive buried strap electrically contacts a buried contact.

According to another mode of the invention, the conductive trench filling, the dielectric layer and the conductive layer are removed to a point below an upper end of the insulation collar.

According to a further mode of the invention, the conductive trench filling, the dielectric layer and the conductive layer are removed only as far as an upper end of the insulation collar.

An advantageous mode of the method according to the invention forms, after forming the insulation collar, a buried plate in the substrate, in the vicinity of the lower region of the trench, so that the buried plate makes contact with a buried well.

A further advantageous mode of the method according to the invention forms an insulation web in the upper region of the insulation collar. The insulation web prevents leakage currents which could discharge the trench capacitor.

In a further method variant, introducing dopant in order to form the buried contact advantageously reduces the contact resistance of the trench capacitor.

According to another mode of the invention, the fabrication method additionally forms a conductive buried strap in the trench. The formation of the buried strap increases the process flexibility since the dopant for fabricating the buried contact can be introduced after the etching-back of the trench filling from within the trench through a vertical interface. Afterward, the conductive strap is formed in order to produce the electrical connection.

The trench capacitor according to the invention and the fabrication method according to the invention have the advantage over conventional methods that the capacitance of the trench capacitor is increased. In particular, the failures due to charges that are too small are reduced and, at the same time, the process yield is increased.

A further advantage is the possibility of reducing the diameter of the trench in the context of advancing miniaturization, since the trench capacitor according to the invention and the fabrication method according to the invention compensate for the reduction in capacitance which stems from the reduction of the area available per memory cell.

The conductive layer may be deposited by CVD (Chemical Vapor Deposition), PECVD (Plasma-Enhanced Chemical Vapor Deposition) or LPCVD (Low Pressure Chemical Vapor Deposition) methods. In this case, it is possible to use materials such as doped or undoped, polycrystalline or amorphous silicon. The doping may be introduced either during the deposition or into the already deposited layer. The doping may be carried out by implantation, gas phase doping and/or plasma-enhanced doping. Furthermore, the conductive layer may be fabricated from a metal in the methods mentioned above. Suitable metals are titanium or tungsten, for example.

With the methods mentioned above it is also possible to deposit silicides such as, for example, tungsten silicide, titanium silicide, molybdenum silicide or cobalt silicide. In order to form a silicide, the metal and the silicon may be deposited in separate steps and then be siliconized at a temperature suitable for the system of materials. Suitable temperatures for this lie between 600° C. and 1100° C.

It is also possible to use a nitride, such as titanium nitride or tungsten nitride, for example. On the one hand, the nitride may be deposited directly by the known methods in order to form the conductive layer. On the other hand, it is also possible for the deposited layer to be subsequently nitrided, with suitable temperatures and process gases.

A further advantage of the conductive layer according to the invention is its effect as an adhesion layer and barrier layer for the storage dielectric used.

The methods mentioned in the previous sections, for fabricating the conductive layer, can also be used for forming the conductive trench filling.

All materials which are sufficiently thermostable and conductive can be used for forming the conductive layer and for forming the conductive trench filling.

In addition, the deposited buried plate is insulated from the conductive trench filling, from the conductive buried strap and from the buried contact by an insulation web in the region of the buried strap. The buried insulation web is composed of insulating material, such as oxide, nitride or oxynitride, for example.

Other features which are considered as characteristic for the invention are set forth in the appended claims.

Although the invention is illustrated and described herein as embodied in a trench capacitor with capacitor electrodes and a corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is diagrammatic, partial sectional view of an exemplary embodiment of a DRAM memory cell according to the invention in accordance with a first mode of the method according to the invention;

FIGS. 2a to 2i are diagrammatic, partial sectional views of semiconductor structures for illustrating the first mode of the method according to the invention for fabricating the DRAM memory cell according to FIG. 1;

DESCRIPTION OF THE PREFERRED EMBODIMENTS

Figure 2A:
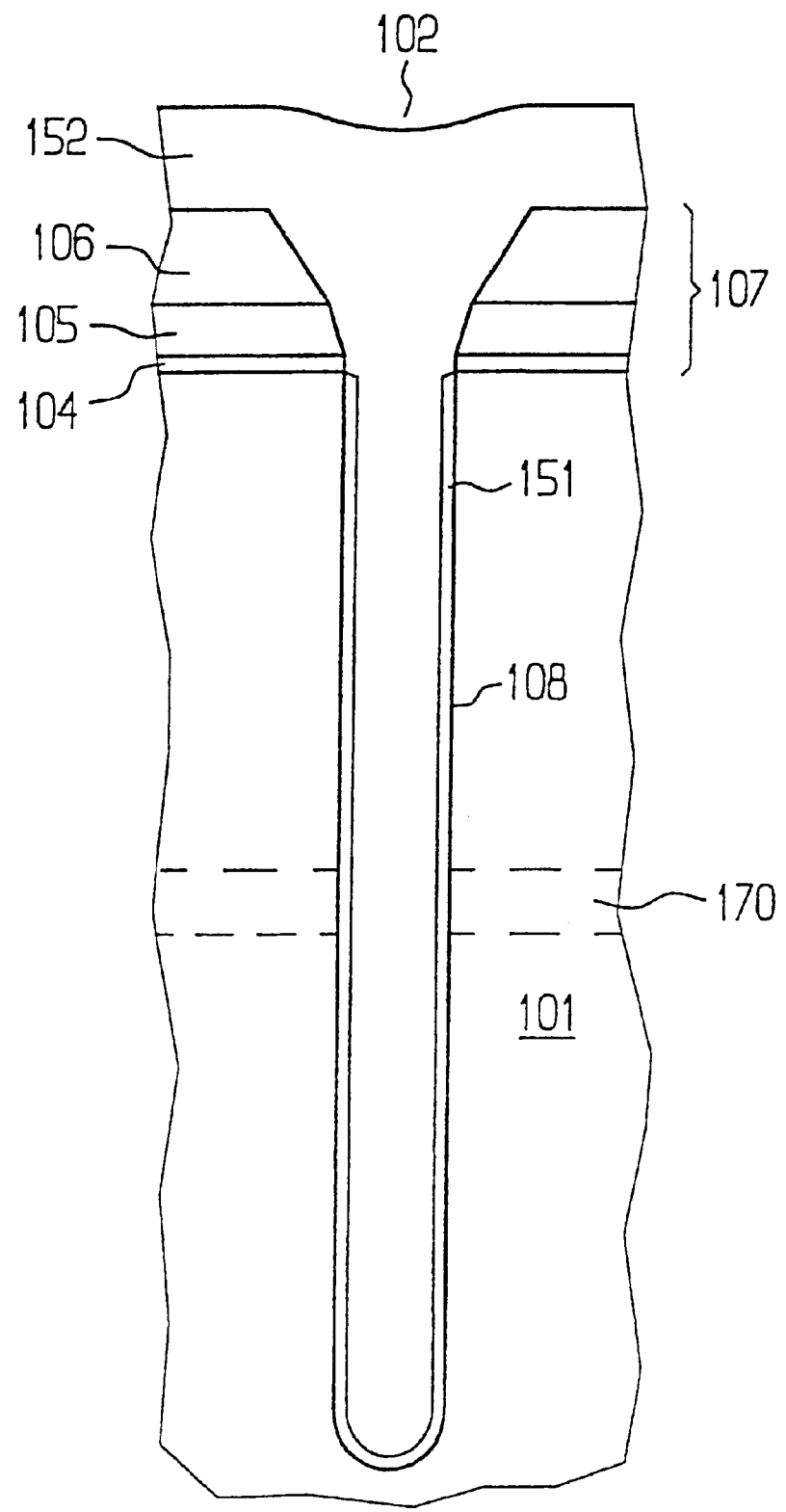

Although applicable to any desired trench capacitors, the present invention is explained with regard to a trench capacitor used in a DRAM memory cell. The invention is described with regard to the formation of an individual memory cell. Identical reference symbols in the figures designate identical or functionally identical elements.

A first embodiment of the invention is shown in FIG. 1. The memory cell 100 illustrated includes a trench capacitor 160 and a transistor 111. The trench capacitor 160 is formed in a substrate 101. A buried well 170, including dopant for example, is introduced in the substrate 101. The trench capacitor has a trench 108 with an upper region 109 and a lower region 110. An insulation collar 168 is situated in the upper region 109 of the trench 108. The lower region of the trench penetrates through the buried well 170. A buried plate 165 may optionally be provided around the lower region 110 of the trench 108. If this is the case, then the buried plates 165 of the adjacent memory cells are connected to one another by the buried well 170.

The lower region 110 of the trench 108 and the insulation collar 168 are lined with the conductive layer 310, which forms the outer capacitor electrode.

The conductive layer 310 is lined with a dielectric layer 164, which forms the storage dielectric. The dielectric layer 164 may be fabricated from layers or layer stacks which include oxide, nitride or oxynitride. It is also possible to use storage dielectrics which have a high dielectric constant, such as, for example, tantalum oxide, titanium oxide, tungsten oxide and any other suitable dielectric.

The trench 108 is filled with a conductive trench filling 161, which forms the inner capacitor electrode.

The conductive buried strap 162 is situated on the trench filling 161 and forms the interface 200 with the trench filling 161. Furthermore, a buried contact 250 is situated in the region of the buried strap 162 with an interface 201 therebetween. The buried contact 250 includes a dopant introduced into the substrate 101.

The conductive layer 310 is lined with an insulation web 320 in its upper region 311, so that no current can flow from the conductive layer 310 to the trench filling 161, to the conductive strap 162 or to the buried contact 250.

The trench capacitor 160 is insulated from adjacent trench capacitors by a trench isolation 180 (STI=Shallow Trench Isolation).

A transistor 111 includes drain region 113 and source region 114, the source region 114 being connected to the buried contact 250 and the drain region 113 being connected to a bit line contact 183, which, for its part, is connected to the bit line 185. Furthermore, the transistor 111 includes a channel 117 controlled by a gate 112. The gate 112 is connected to a word line 120. In this variant, a passing word line 120' runs above the trench isolation 180 and is insulated from the trench filling 161 or the buried strap 162 by the trench isolation 180. A dielectric layer 189 insulates the bit line 185 from the diffusion regions 113, 114.

With reference to FIG. 2A, the substrate 101 is provided, on which the DRAM memory cell is to be fabricated. In the present variant, the substrate 101 is lightly doped with p-type dopants, such as boron, for example. An n-doped buried well 170 is formed at a suitable depth in the substrate 101. Phosphorus or arsenic may be used as dopant for doping the buried well 170. The buried well 170 may be produced by implantation, for example. It serves for insulating the p-type well from the substrate 101 and likewise forms a conductive connection between the conductive layers 310 of the adjacent trench capacitors, or the buried plates 165, if present. As an alternative, the buried well 170 may be formed by epitaxially grown, doped silicon layers or by a combination of crystal growth (epitaxy) and implantation. This technique is described by Bronner et al. in U.S. Pat. No. 5,250,829.

A substructure stack 107 is formed on the surface of the substrate 101 and includes, for example, a substructure oxide layer 104 and a substructure stop layer 105, which can be used as polish or etching stop and is composed of nitride, for example, Provided above the substructure stop layer 105 is a hard mask layer 106, which may include tetraethyl orthosilicate (TEOS) or other materials such as borosilicate glass (BSG), for example. An antireflection coating (ARC) may additionally be used in order to improve the lithographic resolution.

The hard mask layer 106 is patterned using customary photolithographic techniques in order to define a region 102 in which the trench is to be formed. To that end, firstly the hard mask layer 106 is patterned, which is subsequently used as an etching mask for a reactive ion etching step (RIE), which forms a deep trench 108.

A natural oxide layer is formed in the trench 108 and serves as an etching stop in later etching steps. Afterward, the trench is filled with an insulation collar sacrificial layer 152, which ensures sufficient thermostability up to 1100° C. and can be removed selectively with respect to nitride or oxide, such as, for example, polysilicon, amorphous silicon or other suitable materials. The sacrificial layer 152 is composed of polysilicon in this process variant.

As shown in FIG. 2b, the polysilicon sacrificial layer 152 is removed as far as the underside of the insulation collar 168 to be formed. The removal of the sacrificial layer 152 may be carried out for example by planarization by chemical mechanical polishing (CMP) or chemical dry etching (CDE) or a selective ion etching. Afterward, the sacrificial layer 152 is sunk into the trench 108 by reactive ion etching. It is likewise possible to use chemical dry etching to lower the polysilicon 152 in the trench 108.

A dielectric layer is subsequently deposited onto the wafer, which layer covers the substructure stack 107 and the side walls of the trench 108 in its upper region 109. The dielectric layer is used to form the insulation collar 168 and is composed of oxide, for example. The dielectric layer is subsequently etched, for example by reactive ion etching, in order to form the insulation collar 168. The chemical agents for the reactive ion etching are chosen in such a way that the oxide is etched selectively with respect to the polysilicon 152 and the nitride 106.

With reference to FIG. 2c, the polysilicon sacrificial layer 152 is removed from the lower region of the trench 108. This is preferably achieved by CDE, the thin natural oxide layer 151 serving as CDE etching stop. As an alternative, wet etching, for example using KOH or an HF, $HNO_3$ and $CH_3COOH$ mixture, can likewise be used when removing the polysilicon sacrificial layer 152.

After the removal of the sacrificial layer 152, it is optionally possible to form a buried plate 165 with n-type dopants such as, for example, arsenic or phosphorus as capacitor electrode. In this case, the insulation collar 168 serves as a doping mask which limits the doping to the lower region of the trench. A gas phase doping, a plasma doping or a plasma immersion ion implantation (PIII) can be used to form the buried plate 165. These techniques are described for example in Ransom et al., J. Electrochemical. Soc., Volume 141, No. 5 (1994), p. 1378 et seq.; U.S. Pat. No. 5,344,381 and U.S. Pat. No. 4,937,205. An ion implantation using the insulation collar 168 as a doping mask is likewise possible. As an alternative, the buried plate 165 may be formed using a doped silicate glass, such as ASG (arsenic silicate glass), for example, as dopant source. This variant is described for example in Becker et al., J. Electrochemical. Soc., Volume 136 (1989), p. 3033 et seq. If doped silicate glass is used for the doping, then this layer is removed after the formation of the buried plate.

With reference to FIG. 2d, a dielectric layer which is possibly present in the lower region 110 of the trench 108 and may include a naturally grown silicon oxide is removed using HF vapor, for example. Afterward, a conductive layer 310 is deposited onto the wafer, which layer covers the surface of the substructure stack 107 and the interior of the trench 108. The conductive layer 310 serves as outer capacitor electrode. A dielectric layer 164 is subsequently deposited onto the wafer, which layer covers the conductive layer 310 both on the surface of the substructure stack 107 and in the interior of the trench 108. The dielectric layer 164 serves as storage dielectric, for separating the capacitor electrodes. In one variant, the dielectric layer 164 includes an oxide, a nitride, an oxynitride or a layer stack made of oxide and nitride layers. It is also possible to use materials having a high dielectric constant, such as tantalum oxide ($Ta_2O_5$), titanium oxide, tungsten oxide, for example.

The conductive trench filling 161, which may include doped polysilicon or amorphous silicon, for example, is deposited in order to fill the trench 108 and in order to cover the substructure stack 107. For this purpose, it is possible to use, for example, CVD or other known techniques.

With reference to FIG. 2e, the conductive trench filling 161 is planarized for example in a CDE step, in an RIE step, a chemical dry etching step or in a combined CMP-RIE step, using suitable chemicals, and subsequently sunk.

In accordance with FIG. 2f, the dielectric layer 164 is removed above the trench filling 161 through the use of a suitable etching which is selective with respect to the trench filling 161. Afterward, the conductive layer 310 is also removed above the trench filling 161 through the use of a suitable etching which is selective with respect to the dielectric layer 164 and the conductive trench filling 161.

For the etching, it is possible to use selective dry etching processes, which remove the materials one after the other, and also combined dry etching and wet etching processes, in which individual layers, such as the dielectric layer 164, for example, are removed selectively by a wet etching process.

The hard mask layer 106 is likewise removed. This can already be carried out at an earlier time in the process sequence, but only after the formation of the deep trench 108. The insulation collar 168 and the dielectric layer 164 are likewise sunk slightly into the trench 108.

As shown in FIG. 2g, the trench filling 161 is subsequently sunk for example through the use of a CDE step or an RIE step using suitable chemicals. Afterward, the dielectric layer 164 is removed above the interface 200 through the use of a suitable etching which is selective with respect to the trench filling 161. The conductive layer 310 is also removed above the interface 200 through the use of a suitable etching which is selective with respect to the dielectric layer 164 and the conductive trench filling 161.

Afterward, an insulating layer 321, from which the insulation web 320 is formed, is deposited conformally on the substructure stop layer and in the trench 108.

Figure 2H:
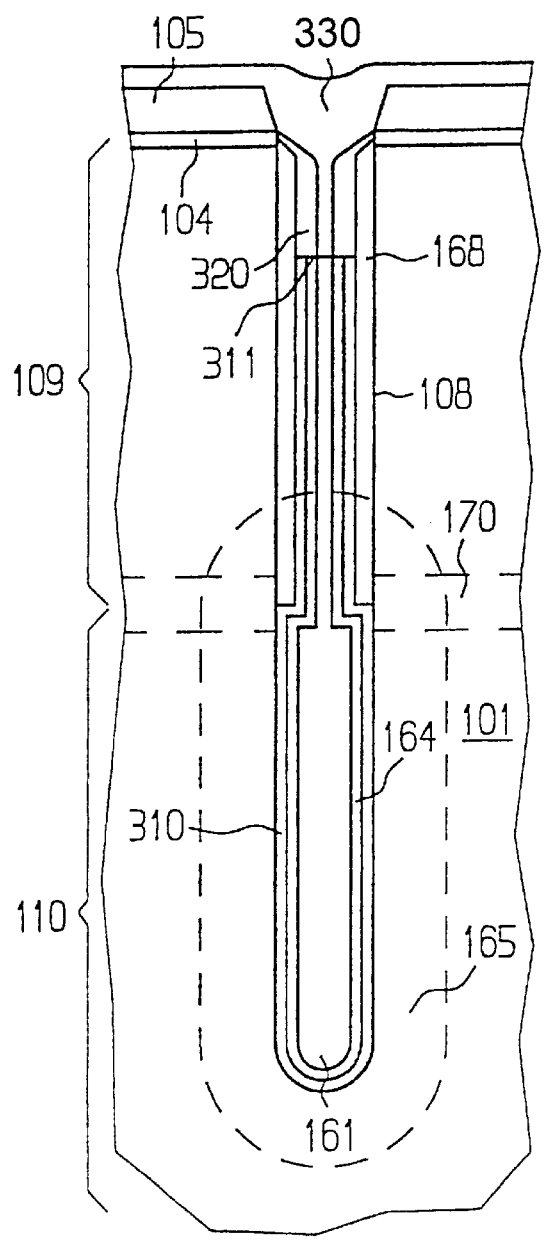

With reference to FIG. 2h, the insulating layer 321 is processed by an anisotropic etching step in such a way that the buried insulation web 320 is formed.

The buried sacrificial layer 330, which may be composed for example of polysilicon or amorphous silicon, is deposited in order to fill the trench 108 and in order to cover the substructure stop layer 105. For this purpose, it is possible to use, for example, CVD or other known techniques.

Figure 2I:
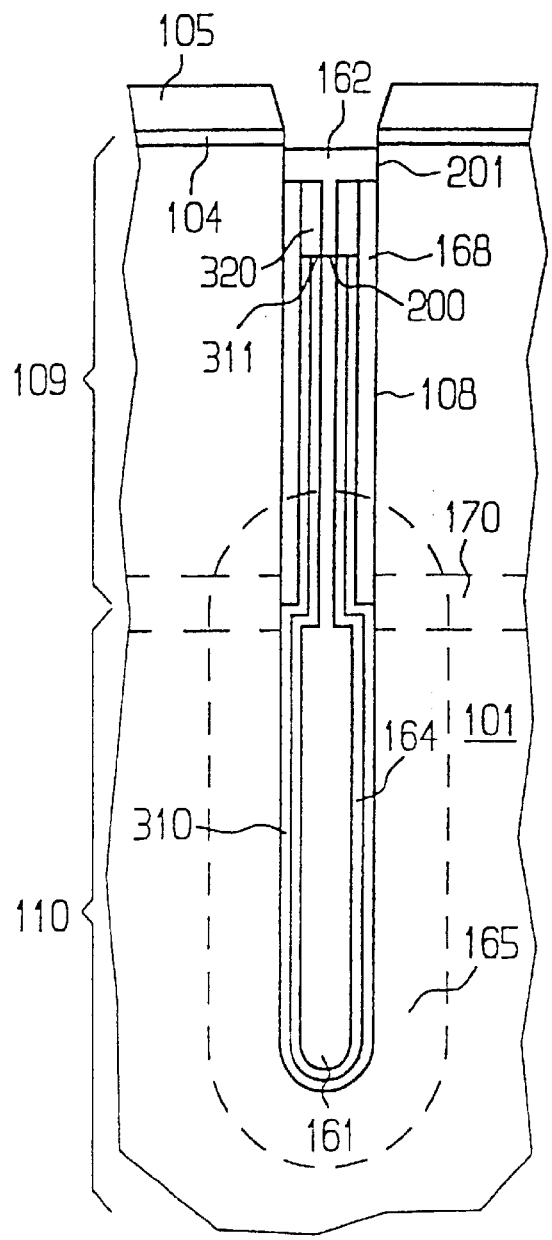

As shown in FIG. 2i, an anisotropic etching step is performed in order to sink the sacrificial layer 330, the insulation web 320 and the insulation collar 168 into the trench 108, which can be carried out for example through the use of a CDE step or an RIE step using suitable chemicals. Afterward, the buried sacrificial layer 330 is completely removed from the trench 108. This can be carried out through the use of a wet etching process, for example. The buried strap 162 is subsequently formed in the trench 108, and is sunk into the trench 108 by an etching step.

The further steps which lead to the memory cell shown in FIG. 1 are not shown in individual figures since they are performed according to the known prior art. The non-active region of the cell is removed and replaced by the trench isolation 180. The photoresist and ARC layers are subsequently removed in order to ensure that no photoresist or ARC residues remain.

The substructure stop layer 105 is likewise removed, this being done by a wet-chemical etching, for example. The wet-chemical etching is selective with respect to oxide. The substructure oxide layer 104 is removed through the use of a wet-chemical etching which is selective with respect to silicon.

The method for fabricating the trench capacitor is thus concluded and the subsequent process steps serve for fabricating the transistor 111 according to the existing prior art, as is described in U.S. Pat. No. 5,867,420.

Figure 3:
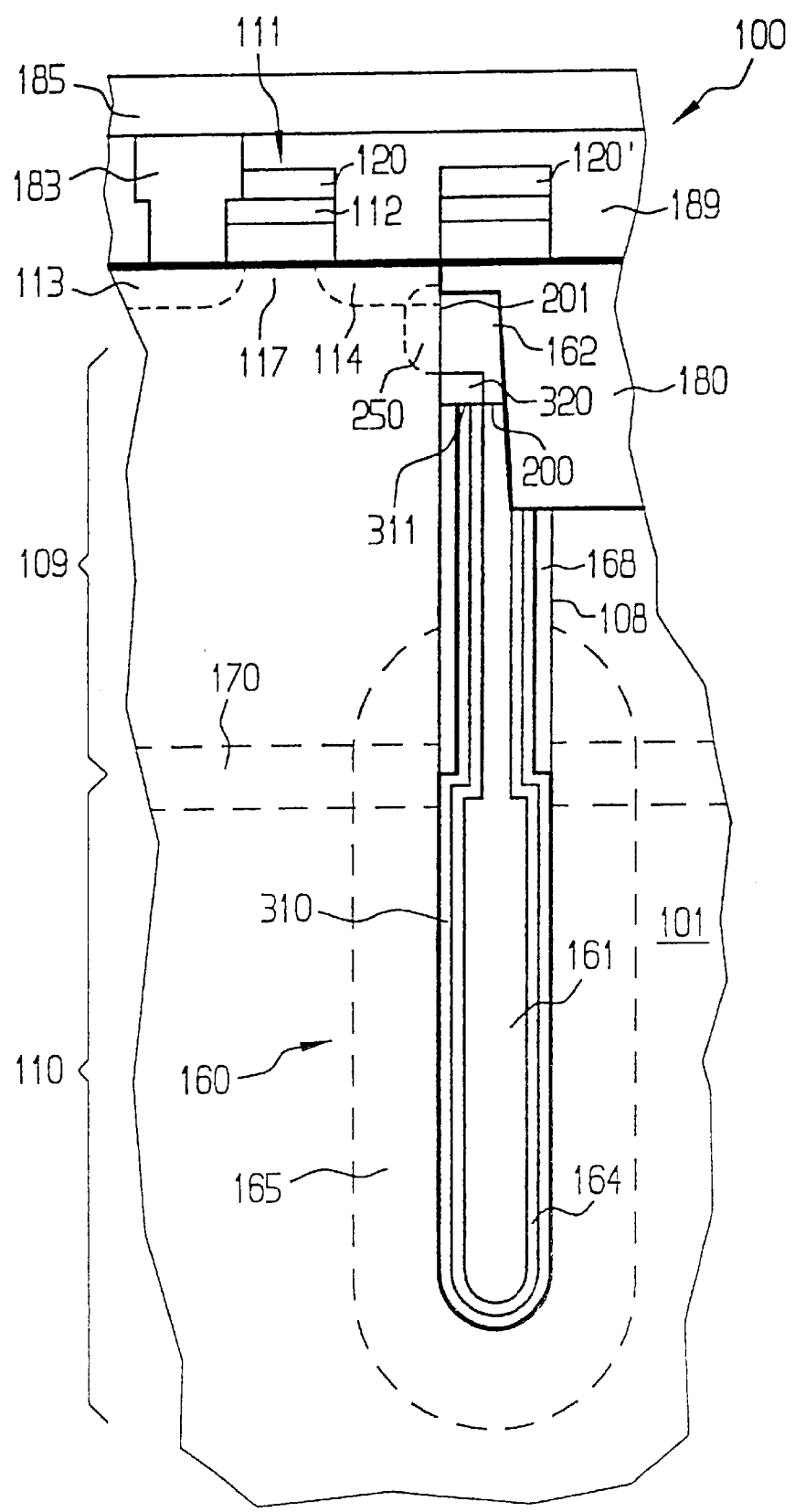
FIG. 3 is diagrammatic, partial sectional view of a further exemplary embodiment of a DRAM memory cell according to the invention in accordance with a second mode of the method according to the invention.

FIG. 3 shows a further embodiment of the trench capacitor 160 according to the invention, which differs from the variant illustrated in FIG. 1 in terms of the embodiment of the insulation web 320. In FIG. 3, the insulation web 320 covers not only the conductive layer 310 in its upper region 311 but also the insulation collar 168.

Figure 4A:
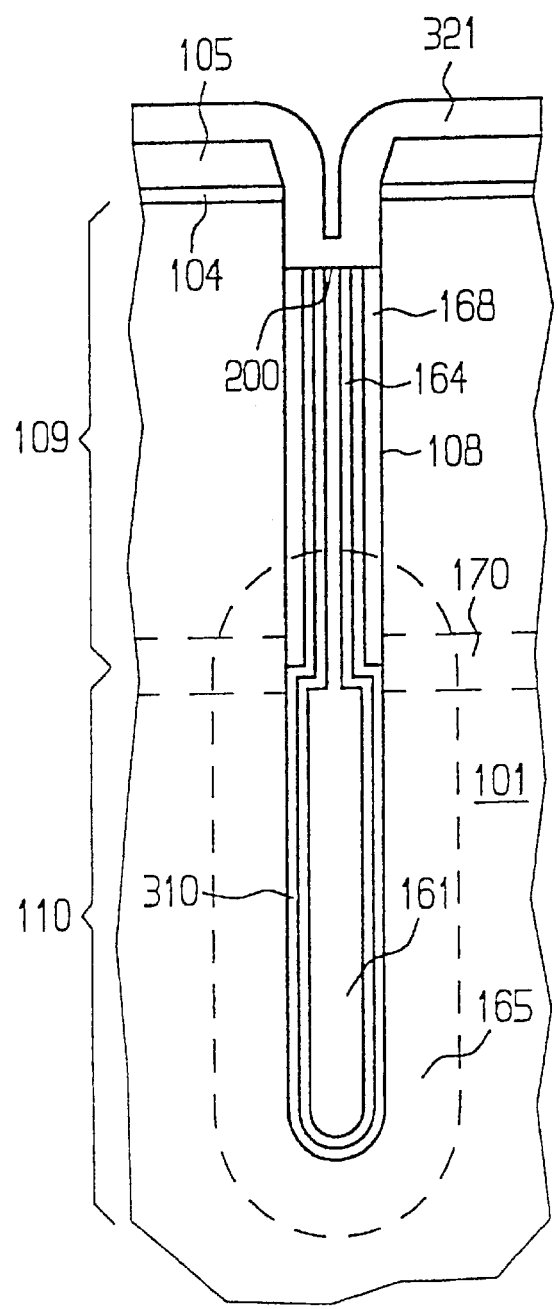
FIGS. 4a and 4b are diagrammatic, partial sectional views of a further embodiment of a DRAM memory cell according to the invention for fabricating the DRAM memory cell according to FIG. 3.

FIG. 4a illustrates the fabrication of the variant of the trench capacitor according to FIG. 3, which follows the process stage from FIG. 2e. Firstly, the trench filling 161, the dielectric layer 164, the conductive layer 310 and the insulation collar 168 are sunk into the trench 108 to the level of the interface 200 by being selectively etched successively in the abovementioned order. An anisotropic etching step which simultaneously removes the trench filling 161, the dielectric layer 164, the conductive layer 310 and the insulation collar 168 is also possible, such as, for example, an RIE etching step in which the hard mask layer 106 serves as an etching mask.

Afterward, the hard mask layer 106 is removed and an insulating layer 321, from which the insulation web 320 is formed, is deposited conformally on the substructure stop layer 105 and in the trench 108.

Figure 4B:
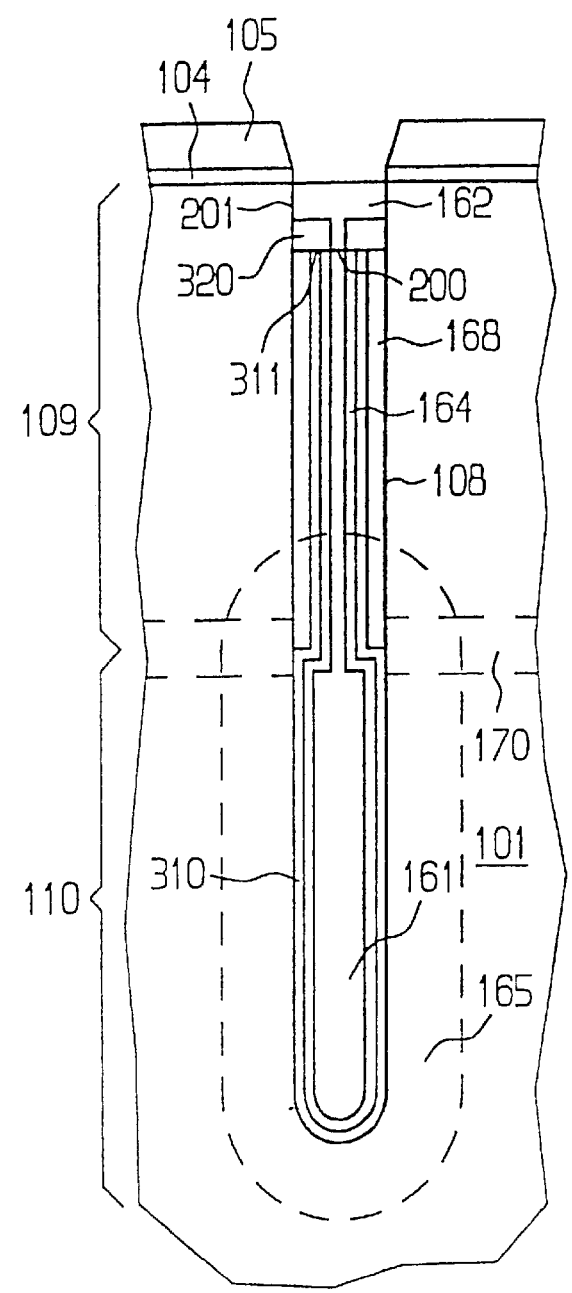

With reference to FIG. 4b, the insulating layer 321 is processed by an anisotropic etching step in such a way that the buried insulation web 320 is formed. The buried strap 162 is subsequently formed, and is likewise sunk into the trench through the use of an etching step.

The subsequent processing steps are carried out, as have already been described with reference to FIGS. 2a to 2i.

As illustrated in FIG. 1, the deposited conductive layer 310 is electrically connected to the buried well 170. This may necessitate prior to the deposition of the conductive layer 310, cleaning the side wall of the trench 108 in the region of the buried plate 170 to remove electrically insulating materials. The materials to be removed may be process residues, nitrides or oxides, such as, for example, natural silicon oxide, as is illustrated in FIG. 2a with the natural oxide layer 151.

With reference to FIGS. 1 and 3, the insulation web 320 is provided in such a way that no leakage currents can flow from the conductive layer 310, which forms the outer capacitor electrode, to the trench filling 161, which forms the inner capacitor electrode, to the buried strap 162 or to the buried contact 250. The insulation web 320 is composed of an insulating material such as, for example, oxide, nitride or oxynitride. In this case, it is also possible to use any other material which has adequate insulation properties and thermal stability. This may involve deposited materials which are processed with a thermal step in order to improve their insulation properties. In the thermal step, it is possible to use process gases which advantageously improve the insulation properties of the insulation web 320. By way of example, process gases such as Ar, $N_2$, $O_2$, $H_2O$, $N_2O$, NO or $NH_3$ can be used for this purpose.

Figure 5:
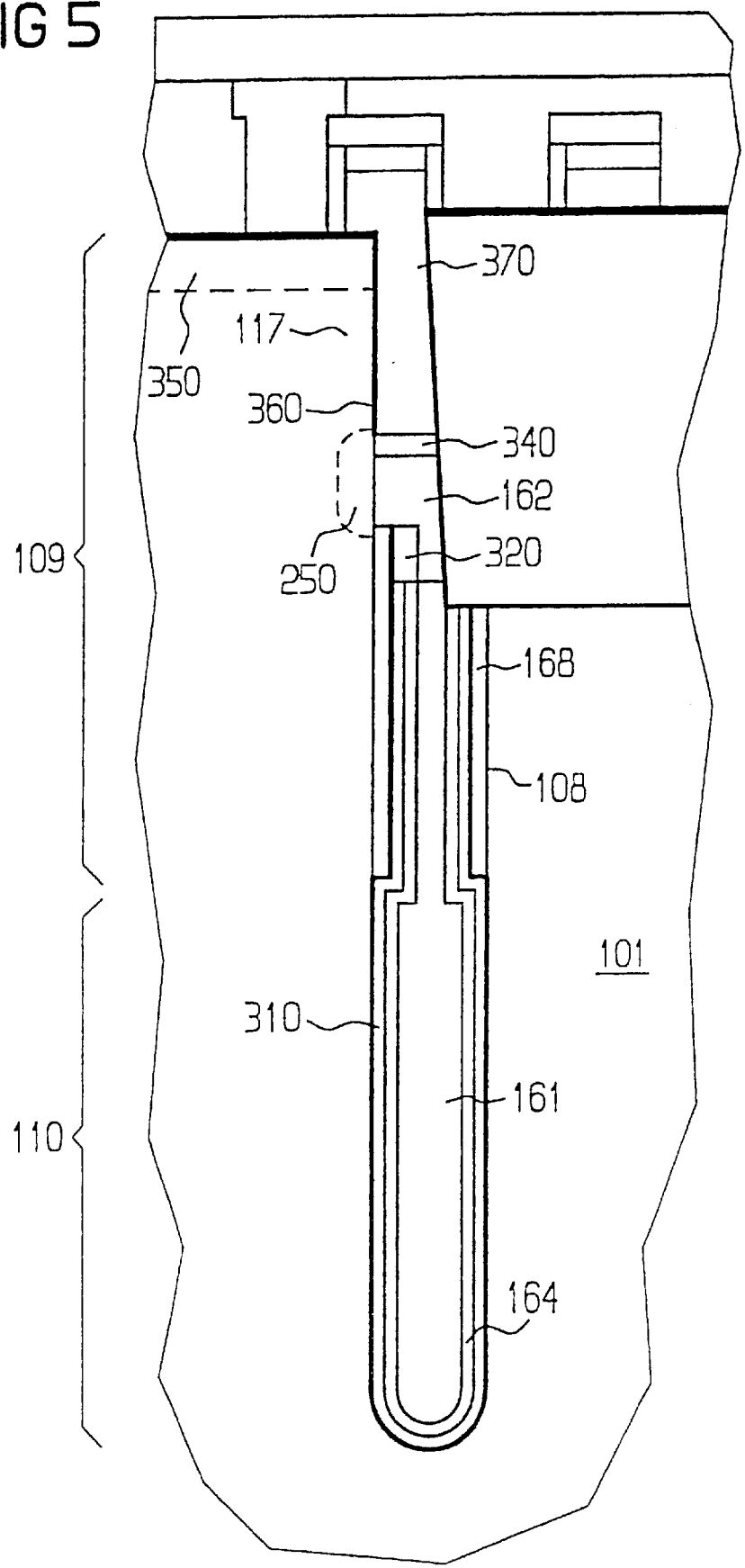
FIG. 5 is diagrammatic, partial sectional view of a further exemplary embodiment of a DRAM memory cell according to the invention with a vertical transistor.

FIG. 5 shows an exemplary embodiment of a DRAM memory cell according to the present invention in accordance with a further embodiment of the method according to the invention.

However, in contrast to the memory cell shown in FIGS. 1 and 3, the variant shown in FIG. 5 has a vertical transistor. The vertical transistor from FIG. 5 is processed exactly like the planar transistor from FIGS. 1 and 3, only after the completion of the trench capacitor 160. The difference in FIG. 5 is that sufficient space for the fabrication of the vertical transistor must be provided above the insulation collar 168. In this case, the embodiment shown in FIG. 5 does not provide a buried well 170. However, the embodiment shown in FIG. 5 can also be provided with a buried well 170.

In order to fabricate the vertical transistor shown in FIG. 5, firstly the buried strap or contact 250, which simultaneously forms the lower source region of the vertical transistor, is introduced by the introduction of dopant by a suitable method, such as, for example, implantation, gas phase doping or plasma-enhanced doping. The buried strap 162 is subsequently deposited in the region of the lower source region of the vertical transistor.

An insulation layer 340 is then fabricated in such a way that it insulates the buried strap 162 and the buried contact 250 from a gate material 370 of the vertical transistor.

A gate oxide 360 is formed for insulating the channel 117 from the gate oxide 360 of the vertical transistor and the gate material 370 is deposited. Furthermore, an upper drain region 350 of the vertical transistor is doped, which is connected to a bit line contact 183.

I claim:

1. A trench capacitor, comprising:
    a substrate formed with a trench having a trench wall, said trench having an upper region and a lower region;
    an insulation collar formed in said upper region of said trench wall;
    a buried layer, said lower region of said trench at least partially extending through said buried layer;
    a dielectric layer disposed at said trench wall in said lower region of said trench and at said insulation collar;
    a conductive trench filling provided in said trench and serving as an inner capacitor electrode;

a conductive layer serving as an outer capacitor electrode, said conductive layer being disposed such that, in said lower region of said trench, said conductive layer is disposed between said substrate and said dielectric layer and, at said insulation collar, said conductive layer is disposed between said insulation collar and said dielectric layer; and said conductive layer including a material selected from the group consisting of a metal, a metal silicide, and a metal nitride.

2. The trench capacitor according to claim 1, further comprising a buried plate formed in said substrate around said lower region of said trench.

3. The trench capacitor according to claim 1, further comprising an insulation web lining said conductive layer at least in an upper region thereof.

4. The trench capacitor according to claim 1, further comprising a conductive buried strap disposed on said conductive trench filling.

5. The trench capacitor according to claim 3, wherein said insulation web is configured to prevent a charge transport from said conductive layer to said conductive trench filling.

6. The trench capacitor according to claim 1, further comprising:

a conductive buried strap disposed on said conductive trench filling; and an insulation web lining said conductive layer at least in an upper region thereof, said insulation web being configured to prevent a charge transport from said conductive layer to said conductive buried strap.

7. The trench capacitor according to claim 1, further comprising:

a buried contact; and an insulation web lining said conductive layer at least in an upper region thereof, said insulation web being configured to prevent a charge transport from said conductive layer to said buried contact.

8. The trench capacitor according to claim 3, wherein said insulation web is a layer selected from the group consisting of an oxide layer, a nitride layer, and an oxynitride layer.

9. The trench capacitor according to claim 1, wherein said conductive layer includes a material selected from the group consisting of titanium, tungsten, molybdenum, cobalt, titanium silicide, tungsten silicide, molybdenum silicide, cobalt silicide, titanium nitride, and tungsten nitride.

* * * * *